United States Patent [19]
Cho et al.

[11] Patent Number: 5,638,381
[45] Date of Patent: Jun. 10, 1997

[54] APPARATUS AND METHOD FOR DERIVING CORRESPONDENCE BETWEEN STORAGE ELEMENTS OF A FIRST CIRCUIT MODEL AND STORAGE ELEMENTS OF A SECOND CIRCUIT MODEL

[75] Inventors: Hyunwoo Cho; Carl Pixley, both of Austin, Tex.

[73] Assignee: Motorola, Inc., Schaumburg, Ill.

[21] Appl. No.: 505,431

[22] Filed: Jul. 21, 1995

[51] Int. Cl.$^6$ .................................................. G06F 15/60
[52] U.S. Cl. ...................... 371/22.4; 371/25.1; 364/490; 364/488
[58] Field of Search .................... 371/22.4, 24, 22.5, 371/25.1; 364/488, 489, 490, 491; 395/500; 595/500, 800

[56] References Cited

U.S. PATENT DOCUMENTS

| | | | |
|---|---|---|---|
| 5,278,769 | 1/1994 | Bair et al. | 364/490 |
| 5,377,122 | 12/1994 | Werner et al. | 364/488 |
| 5,426,770 | 6/1995 | Nuber | 395/500 |
| 5,459,673 | 10/1995 | Carmean et al. | 364/489 |
| 5,515,384 | 5/1996 | Horton, III | 371/22.4 |

*Primary Examiner*—Robert W. Beausoliel, Jr.
*Assistant Examiner*—Nadeem Iqbal
*Attorney, Agent, or Firm*—J. Gustav Larson

[57] ABSTRACT

A method and circuit for determining correspondences between storage elements of a first circuit model and storage elements of a second circuit model. A first circuit model is received (102) and a second circuit model is received (104). Next, input correspondences (106) and output correspondences (108) between the circuit models are received. Each of the circuit models include a plurality of inputs, a plurality of outputs, a plurality of storage elements, and a plurality of logic functions. Signatures of each uncorresponded storage elements in the first circuit model (110) and the second circuit model (112) are determined. The signatures of the storage elements are compared (114). When a signature of a storage element of the first circuit model compares favorably to a signature of a storage element of the second circuit model, a correspondence is determined between the respective storage elements (116). Compatible cluster analysis may also be used in the method.

24 Claims, 9 Drawing Sheets

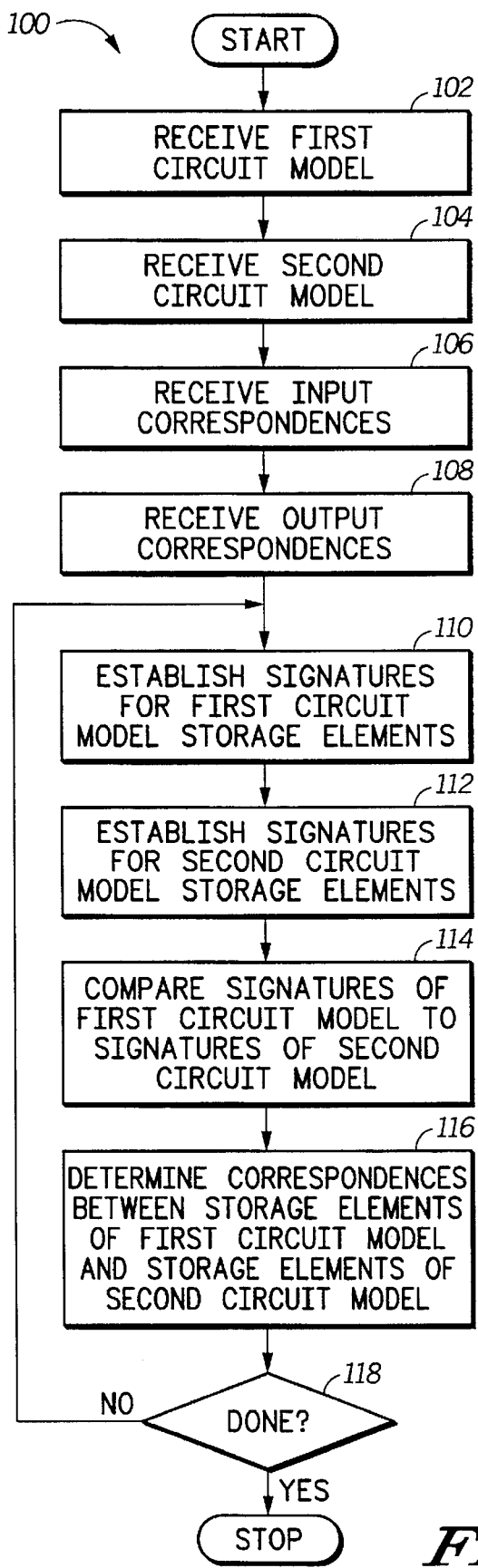
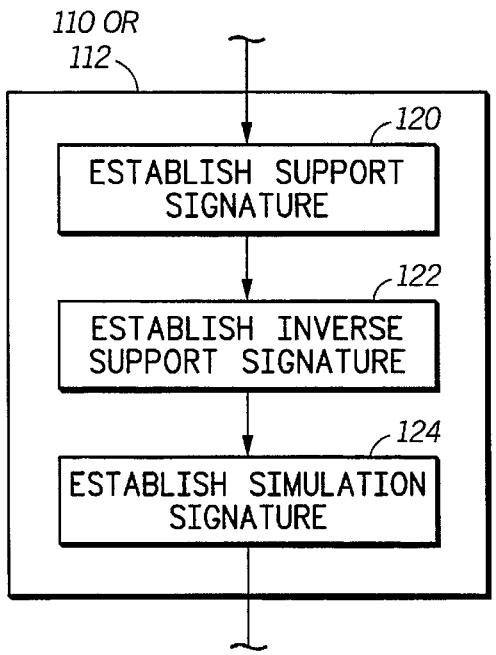
FIG.2
FIG.3

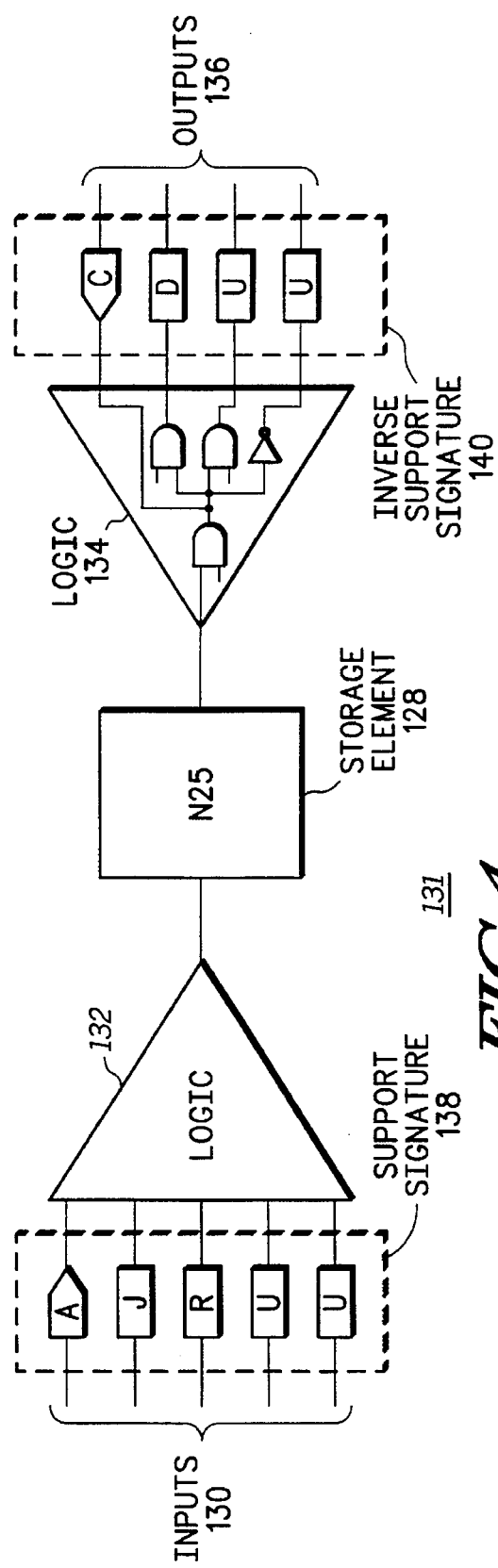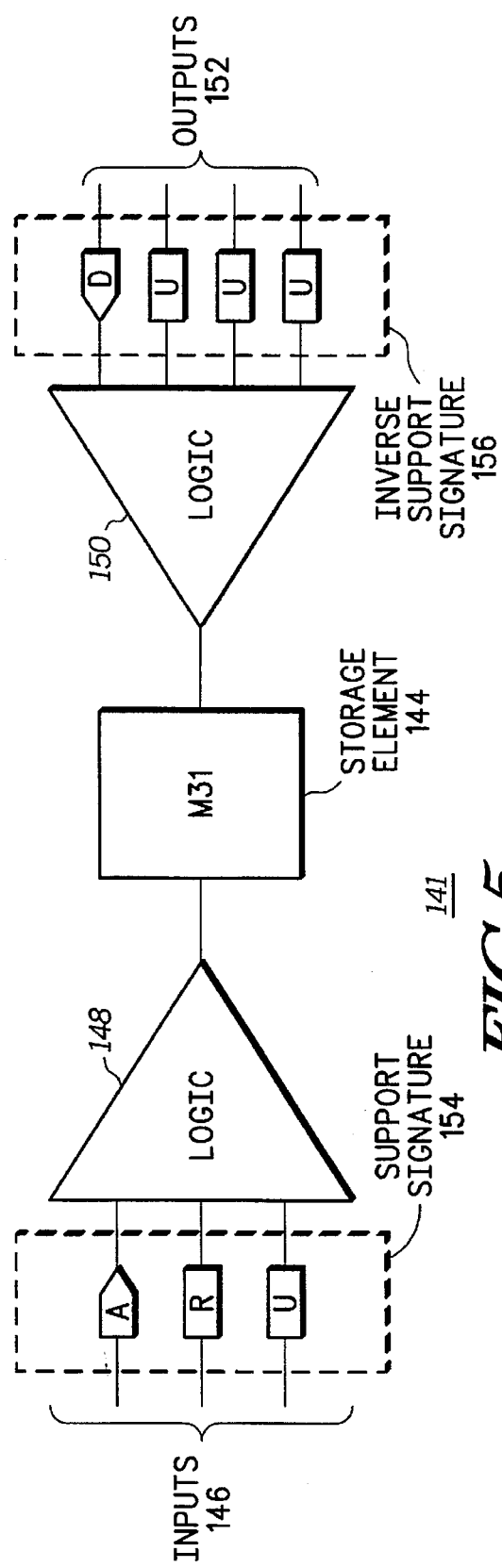

APPARATUS AND METHOD FOR DERIVING CORRESPONDENCE BETWEEN STORAGE ELEMENTS OF A FIRST CIRCUIT MODEL AND STORAGE ELEMENTS OF A SECOND CIRCUIT MODEL

TECHNICAL FIELD OF THE INVENTION

This invention relates generally to verification of digital circuitry and more particularly to an apparatus and method for determining the correspondence between storage elements of a first circuit model and storage elements of a second circuit model.

BACKGROUND OF THE INVENTION

With the increase in complexity of modern integrated circuitry, the need to mathematically model the circuitry prior to fabrication has become more important. While the modeling of digital circuitry as well as analog circuitry has been performed for many years using computer analysis, modeling has recently become more important because of the size and complexity in modern integrated circuitry. Many modeling tools currently exist that may be used to check or verify the validity of a circuit prior to its construction. Some of these tools model the digital circuit at the register transfer level (RTL) of the digital circuit while other tools model the digital circuits at the gate level.

A typical design process wherein an integrated circuit is taken from conception to construction includes a variety of steps. In a first step, the conceptual nature of the integrated circuit is determined. The conceptual nature typically relates to the overall desired functions of the digital circuit. In the case of a complex microprocessor, the conceptual nature of the circuit is typically modeled in a high level language and verified using a high level simulator. Various tools exist to model the complex logic functions implemented in the circuit to ensure that all desired logic functions will be performed.

Once the conceptual nature of the circuit is determined, the RTL level model of the digital circuit is designed based upon the conceptual model and is modeled on a digital computer using an RTL modeling tool. At this time, the design of the circuit, as modeled within the RTL modeling tool, may be used to verify the design. Further, the RTL modeling tool, in some cases, may allow the validity of the circuit as modeled to be cross referenced to the high level language model. The RTL level model may also be used to alter the design of the circuit within the RTL level modeling tool.

Once the RTL level model is completed, it is then transformed into a gate level model wherein individual logic gates required to perform the logic functions of the circuit as modeled in the RTL level model are implemented. Further verification, testing, and optimization testing may be performed using gate level model tools in conjunction with the gate level model. Because the gate level model implements actual logic functions using logic gate models while the RTL level model consists primarily of logical instructions, the function of the gate level model must be verified with respect to the RTL level model. Various tools exist to verify the operation of the gate level model with respect to the RTL level model.

Once the gate level model is completed, the gate level model is transformed into a transistor or switch level model. The switch level model is then used to create the physical design for the integrated circuitry and the physical design is used to generate the mask sets which are employed in the manufacturing process to create the actual integrated circuit. The mask sets are then used in the fabrication processes to depose the circuit on a semiconductor wafer or other substrate.

Because modern integrated circuitry is extremely complex and the number of gates implementing a particular circuit may include millions of transistors, it is important to verify the operation of the integrated circuitry at each level prior to its construction. Thus, various programs have been developed at the RTL level and at the gate level to simulate the operation of the integrated circuit design. However, it has been determined that a simple simulation of the integrated circuit model is insufficient to ensure the correct operation of the integrated circuitry. As one skilled in the art will readily appreciate, with the number of transistors in a large integrated circuit exceeding one million transistors, not all possible cases may be simulated so that the simulation results may be verified. Even if the complete number of cases could be simulated, as one skilled in the art will readily appreciate, the number of variations typically exceeds the capability of a tool to check the cases.

Because it is relatively easier to verify the operation of an integrated circuit model at the RTL level than either at the gate or switch level model, designers often rely on the validity of the RTL level model as a benchmark. However, even though the RTL level model may be judged correct by a designer, the gate level model and switch level model may have developed errors in their operation through the transformation from the RTL level model. Thus, it is desirable to ensure that both the transistor level model and the gate level model operate in accordance with the RTL level model.

Further, logic is often optimized within the gate level model to reduce the area required to construct the circuit, to increase the speed of operation of the circuit, to reduce the power consumption of the circuit, or to optimize the logic operation of the circuit itself. Once the gate level logic of the circuit model has been optimized, its operation must be verified with respect to the RTL level model or the prior gate level model.

In some situations it is advantageous in order to benefit from newer fabrication technologies to take an existing integrated circuit design and to convert the design to take advantage of the new process technology. In this situation, a gate level model is extracted from a prior switch level model and then mapped to a new gate level library implementing the new fabrication process. Once the new gate level model has been generated, the logical operation of the new gate level model must be verified with respect to the prior gate level model or the prior RTL level model.

In some situations, a scan logic circuit is inserted into a circuit model after the model has been created. While the scan logic circuit is generally intended not to affect the normal operation of the integrated circuitry, the addition of the scan logic circuit, if inadvertently placed, may affect the logic operation of the integrated circuit. Thus, the circuit model including the scan logic circuit must be checked to determine whether the normal operation of the circuit has been affected, and checked against the prior gate level model or RTL level model.

FIG. 1 shows a logical representation of a first circuit model 540 and a second circuit model 542. As is known in the art, a circuit model includes a plurality of inputs 502 and a plurality of outputs 504 with certain logical functions required for the outputs depending upon the set of inputs. Within the first circuit model 540, or any circuit model, are also a plurality of storage elements 506, 508, 510, 512. In an actual circuit at power-up, storage elements have unknown values unless forced to specific known states. Thus, in a typical integrated circuit, a set of input instructions sets the storage elements to known values.

As is diagrammatically shown in FIG. 1, the first circuit model includes a plurality of storage elements. Each of these storage elements typically receives input data from a number of sources. The sources providing data to storage elements include inputs, stored values of other storage elements, and stored value of the storage element itself. Input values are provided to a storage element through a "cone" of logic as represented by elements 514, 516, 518, and 520. The cone of logic is diagrammatically illustrated as a triangle. The cone of logic may include any number and variety of logical functions with the output of the cone of logic providing an input value to the storage element.

FIG. 1 also illustrates a second circuit model that is related to the first circuit model in some manner. In some situations, such as those described above, the first circuit model and the second circuit model are compared to verify the equivalence of operation of the circuit models. In this situation the inputs of the first circuit model and the inputs of the second circuit model correspond to one another while the outputs of the first circuit model and the outputs of the second circuit model also correspond.

Prior verification tools looked simply at the inputs and outputs of the respective circuit models to determine whether the functions of the circuits were equivalent. However, as was previously discussed, a simulation of this type cannot thoroughly check the operation of the circuits. Such is the case because the values of the storage elements within the respective circuit models must be compared as well to ensure an equivalence between the circuit models. In many situations it is desirable to verify an exact equivalence between a first circuit model and a second circuit model. Such an equivalence operation may only be determined by viewing the storage element contents at each operation step of the models.

Certain commercially available circuit modeling tools have functions built in to relate storage element contents of storage elements of one circuit model to storage elements of a second circuit model in order to verify the operation of the circuits. However, the correspondences between the storage elements of the respective models must be provided by the user of the tool. Thus, even though these tools may verify the logical functions of the respective storage elements of the first circuit model and the second circuit model, the relationship or correspondence of the respective storage elements must be provided. These tools do not, by themselves, determine the correspondence between the storage elements of the respective models. Thus, prior techniques have been developed in an attempt to match storage elements of a first circuit model with storage elements of a second circuit model.

One particular prior solution took a simplified step in matching storage elements of a first circuit model with storage elements of a second circuit model. The solution compared the names of storage elements of a first circuit model with storage elements of a second circuit model in order to determine correspondences. As one skilled in the art will readily appreciate, however, there is little basis for matching storage elements based upon the names assigned to particular storage elements. If the first circuit model and the second circuit model are generated from different circuit hierarchies, there will be no match of names between the circuit models. Thus, the prior solution simply identifying names between one circuit model and another circuit model is insufficient at best.

Thus there exists a need in the art for a method and apparatus for determining the correspondences between storage elements of a first circuit model and storage elements of a second circuit model.

BRIEF DESCRIPTION OF THE DRAWINGS

FIG. 2 illustrates a flow diagram of a method for deriving correspondences between storage elements of a first circuit model and storage elements of a second circuit model in accordance with the present invention;

FIG. 3 illustrates a logic diagram detailing steps required for establishing signatures of storage elements in accordance with the present invention;

FIG. 4 illustrates a block diagram of the components required to establish support signatures and inverse support signatures for storage elements in a first circuit model in accordance with the present invention;

FIG. 5 illustrates a block diagram of the components required to establish support signatures and inverse support signatures for storage elements in a second circuit model in accordance with the present invention;

DETAILED DESCRIPTION OF THE DRAWINGS

Figure 1:
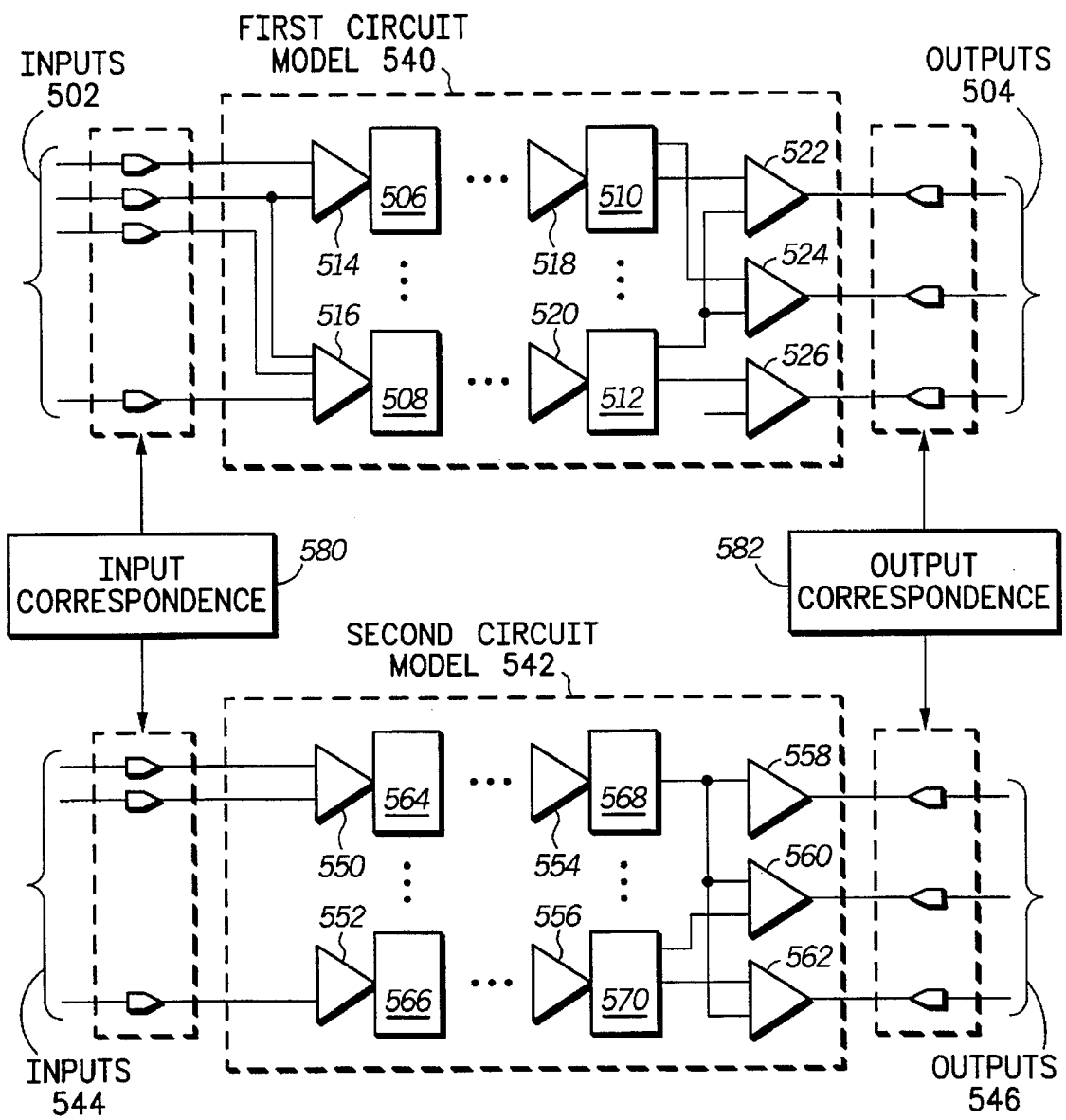
FIG. 1 illustrates a block diagram of a prior art first circuit model and a prior art second circuit model.

The apparatus and method of the present invention derive the correspondences between storage elements of a first circuit model and storage elements of a second circuit model. The apparatus and method receive input correspondences between the first circuit model and the second circuit model and also the output correspondence between the first circuit model and the second circuit model. Each of the circuit models include a plurality of inputs, a plurality of outputs, a plurality of storage elements, and a plurality of logic functions. The correspondences between the storage elements of the respective models are found by determining signatures of each of the storage elements of the first circuit model and each of the storage elements of the second circuit model. When a signature of one of the plurality of storage elements of the first circuit model compares favorably to a signature of one of the plurality of storage elements of the second circuit model, a correspondence is determined between the respective storage elements. In this fashion, based upon this signature analysis methodology, a complete correspondence between the storage elements of the first circuit model and the storage elements of the second circuit model may be determined. Based upon this correspondence, the equivalence between the first circuit model and the second circuit model may be determined.

FIG. 2 illustrates a flow diagram of a method 100 for deriving the correspondences between storage elements of a first circuit model and storage elements of a second circuit model. The method includes at block 102 receiving the first circuit model. The first circuit model includes a plurality of inputs, a plurality of outputs, a plurality of storage elements, and plurality of logic functions. Next, at step 104 the method includes receiving a second circuit model, wherein the second circuit model includes a plurality of inputs, a plurality of outputs, a plurality of storage elements, and plurality of logic functions. The method proceeds next to step 106 and includes receiving input correspondences between the plurality of inputs of the first circuit model and the plurality of inputs of the second circuit model. Next, at step 108 the method includes receiving output correspondences between the plurality of outputs of the first circuit model and the plurality of outputs of the second circuit model.

Next, at step 110, the method includes establishing a signature for at least some of the plurality of storage elements of the first circuit model. The signature, as will be described more fully herein, is based upon a unique characteristic of each of the storage elements. Next, at step 112, the method includes establishing a signature for at least some of the plurality of storage elements of the second circuit model. In step 112 as well, the signature for each of the storage elements would include characteristics that are unique to the particular storage elements. Next, at step 114, the method includes comparing the signatures of the storage elements of the first circuit model to the signatures of the storage elements of the second circuit model.

The method then proceeds to step 116 wherein the correspondences between the storage elements of the first circuit model and the storage elements of the second circuit model are determined. A correspondence is determined in between a storage element of the first circuit model and a storage element of the second circuit model when a particular signature of a storage element of the first circuit model compares favorably to a particular signature of a storage element of the second circuit model. Preferably, a favorable comparison occurs when a single signature of a storage element of the first circuit model equals a single signature of a storage element of the second circuit model.

At step 118, it is determined whether or not the method is completed. If the method is completed, each of the storage elements of the first circuit model has been determined to correspond to exactly one of the storage elements of the second circuit model, the method is done and stops. However, if the correspondences between the first circuit model and the second circuit model have not been completed, the method returns to step 110 wherein further correspondences are determined employing the steps of the present invention. In accordance with the steps of the present invention, the storage elements of a first circuit model may be directly related to the storage elements of a second circuit model. Once the storage elements have been related, the circuit models may be further verified.

Thus, the method of present invention provides a correspondence between the storage elements of a first circuit model and storage elements of a second circuit model. With such correspondences determined, the validity of the circuit models may be checked. The methodology used by the present invention guarantees a correct correspondence between the storage elements of the respective circuit models. No technique for determining such correspondences has previously been available.

FIG. 3 illustrates a flow diagram detailing step 110 of FIG. 2. Within step 110, the step of establishing a signature for a particular storage element may include further steps. A first further step 120 includes establishing a support signature for the storage element. Step 122 includes establishing an inverse support signature for the storage element. Step 124 includes establishing a simulation signature for the particular storage element. The method for determining signatures will be discussed later. The further steps 120 through 124 may be incorporated in either step 110 or step 112 of FIG. 2 to provide additional criteria to judge whether or not there is a correspondence a storage element of the first circuit model and a storage element of a second circuit model.

As one skilled in the art will readily appreciate, signatures of many of the storage elements of the first circuit model may be identical to many of the signatures of storage elements of the second circuit. Thus, further means are required for identifying the identity of the particular storage elements to use in corresponding the storage elements to one another. The steps illustrated in FIG. 3 provide such additional steps for determining correspondences.

FIG. 4 and FIG. 5 illustrate the methodology for determining support signatures and inverse support signatures of the various storage elements of the first circuit model and the second circuit model. The description includes certain assumptions relating to the identification of storage elements within the first circuit model and the second circuit model. Primary inputs are referred to by letter designation, such as primary input A of the inputs 130, and are shown as the primary input element shape. Storage elements are referred to by a capital letter other than U and are represented as a box. However, only those storage elements that have been determined to correspond to particular storage elements of another model are labeled with letters other than U. Those storage elements labeled with the letter U have not been determined to correspond to a particular storage element in the other model. Thus, numerous storage elements in FIG. 4 and FIG. 5 are referred to with the letter U. Each of the storage elements is also uniquely identified within the particular circuit model. For example in FIG. 4, storage element 128, identified as N25 128, is a storage element within the first circuit model 131, while in FIG. 5, storage element 144, identified as M31 144, is a storage element within the second circuit model 141. Assuming that each of these storage elements has not been corresponded to a storage element of the opposing circuit model, each of the elements also retains the U designation.

The purpose of the present invention is to determine a correspondence between each storage element of the first circuit model 131 and each storage element of the second circuit model 141. Thus, after the purpose of the present invention has been accomplished, no storage elements will have the U designation and will each have been corresponded to a storage element of the other model. A separate table will therefore be kept designating the correspondences between storage elements of the first circuit model and storage elements of the second circuit model and a unique designation, other than U, will be assigned to the two corresponding storage elements. For example, storage elements of the first circuit model 131 may be represented by the designation Mxx, wherein xx is a positive integer, while storage elements of the second circuit model 141 may be represented by the designation Nyy, wherein yy is a positive integer. A table may then be developed relating Mxx to Nyy wherein each storage element has only a single correspondence. When a correspondence has been determined, each of the corresponding storage elements is assigned a common and unique designation and the U designation is removed. Upon completion of the method of the present invention, each storage element of the first circuit model will have a correspondence with a storage element of the second circuit model.

Creating a support signature for a particular storage element includes determining which storage elements provide input to the storage element. Creating an inverse support signature for a particular storage element includes determining which storage elements receive output from the storage element. Each storage element within a circuit model will have both a support signature and an inverse support signature.

A determination of the support signature and inverse support signature of storage element N25 proceeds in the following manner. Storage element 128, identified as N25, receives inputs 130 through a cone of logic 132. The inputs 130 include primary input A, previously corresponded storage elements J and R and two storage elements that have not been corresponded, referenced as U. At each iteration of the method of the present invention, at least a few of the storage elements will retain the designation U since they have not been corresponded to a storage element of the opposing circuit model. The cone of logic 132 may include various logic gates utilizing the inputs 130 to produce a resultant for the storage element N25. Preferably, storage element N25 comprises a single bit storage unit that may change states at each clock cycle of the integrated circuit depending upon the state of the inputs 130.

Based upon the identity of the inputs 130, a support signature 138 may be determined for storage element N25. The support signature 138 includes, as elements in the signature, each of the inputs 130 to the cone of logic 132 that provide input to storage element N25. In the particular example shown, the support signature 138 comprises the string (A, J, R, U, and U). Preferably, entries in the support signature 138 are in an ascending or descending order based upon an established criteria.

Storage element N25 provides its output as an input to a cone of logic 134. The cone of logic 134 provides outputs 136 to various other storage elements, and perhaps system outputs. The cone of logic 134 of course has additional inputs from various other storage elements and primary inputs to produce the outputs 136. The outputs 136 will typically include primary outputs and storage elements. For example, with respect to storage element N25 128, the outputs 136 include primary output C, storage element D that has previously been corresponded to a storage element of the other model and two storage elements that have not yet been determined to correspond with particular storage elements of the other model.

Based upon the identity of the outputs 136, the inverse support signature 140 for storage element N25 may be determined. The inverse support signature 140 is a string based upon the outputs receiving data from the particular storage element N25. In the present example, the inverse support signature 140 comprises the string (C, D, U, and U). With the inverse support signature as well, the elements of the inverse support signature are ordered in an established convention.

Thus, based on merely inputs 130 and the outputs 136, the support signature 138 and inverse support signature 140 of the storage element N25 may be determined. After each iteration of the method of the present invention, the support signature 138 and the inverse support signature 140 may be updated as inputs 130 and outputs 136 are corresponded with the storage elements of the other circuit model 141. As one skilled in the art may readily appreciate, as the number of storage elements that have not been corresponded to storage elements of the opposing circuit model decreases, the number of elements of the support or inverse support signature represented by the letter U, are reduced.

FIG. 5 also illustrates the construction of support signatures for storage element 144, identified as M31 144. Storage element M31 144 receives its input from a plurality of inputs 146 through a cone of logic 148. Storage element M31 144 provides output through a cone of logic 150 to a plurality of outputs 152. Based upon the inputs 146 a support signature 154 for storage element M31 144 is created. Inputs 146 include primary input A, storage element R that has been corresponded to a storage element of the other circuit model, and an unknown storage element. Thus, the support signature 154 for storage element M31 144, based upon the corresponded inputs comprises the string (A,R,U). Based upon the outputs 152 receiving input from storage element M31, the inverse support signature 156 of storage element M31 144 comprises the string (D,U,U,U).

As part of step 116 of the present invention of determining a correspondence between the storage element of the first circuit model with respect to the storage element of the second model, the signatures of storage element N25 128 are compared to the signatures of storage element M31 144. Upon a comparison of support signature 138 with support signature 154, it is determined that the support signatures do not match. They do not match for two reasons, the first reason being that storage element N25 128 has a support signature 138 with five inputs while support signature 154 for storage element M31 144 includes three elements. Second, support signature 138 for storage element N25 128 comprises the string (A,J,R,U,U) while support signature 154 for storage element M31 144 comprises the string (A,R,U). Thus, support signature 138 does not equal support signature 154 and therefore the support signatures do not match. The inverse support signature 140 for storage element N25 125 comprises the string (C,D,U,U) while the inverse support signature 156 of storage element M31 comprises the string (D,U,U,U).

As between two storage elements, the mismatch of support signatures, inverse support signatures, or simulation signatures is sufficient to determine that the respective storage elements do not correspond to one another. Thus, because the support signatures of storage elements N25 and M31 do not match one another, storage element N25 does not correspond to storage element M31. Further, because the inverse support signatures of storage elements N25 and M31 do not match one another, it is also determined that the storage elements do not correspond to one another.

In the example illustrated in FIG. 4 and FIG. 5, the comparison of signatures of storage element N25 with the signatures of storage element M31 is relatively easy to perform. However, in many situations, due to the large number of uncorresponded storage elements in the first and second circuit models, support signatures of many storage elements will be identical. Further, inverse support signatures of many storage elements will be identical. When many signatures match, it is impossible to determine which of the storage elements of the first circuit model correspond to the storage elements of the second circuit model.

Thus, in the method of the present invention, the step of determining a correspondence requires a further limitation. The limitation requires that the signature of one of the plurality of storage elements of the first circuit model compares favorably to the signature of one of the plurality of storage elements of the second circuit model when only one of the signatures of the plurality of storage elements of the first circuit model equals only one of the signatures of the storage elements of the second circuit model. Under this correspondence criteria, a correspondence is determined for a particular storage element if there is only one correspondence with a storage element of the second circuit model. One skilled in the art will readily appreciate that the iterative methodology of the present invention is required to further reduce the number of uncorresponded storage elements between the circuit models. In operation, the method of the present invention requires a number of iterations to completely determine the correspondences between the storage elements of the first circuit model with the storage elements of the second circuit model. The number of iterations required to completely determine the correspondences depends upon the number of storage elements, the number of inputs, the number of outputs, the number of correspondences provided to the method, and the complexity of the logical circuitry of the circuit models. Thus, in each particular application of the method of the present invention to circuit models differing number of iterations will be required to achieve a complete correspondence.

Figure 6:
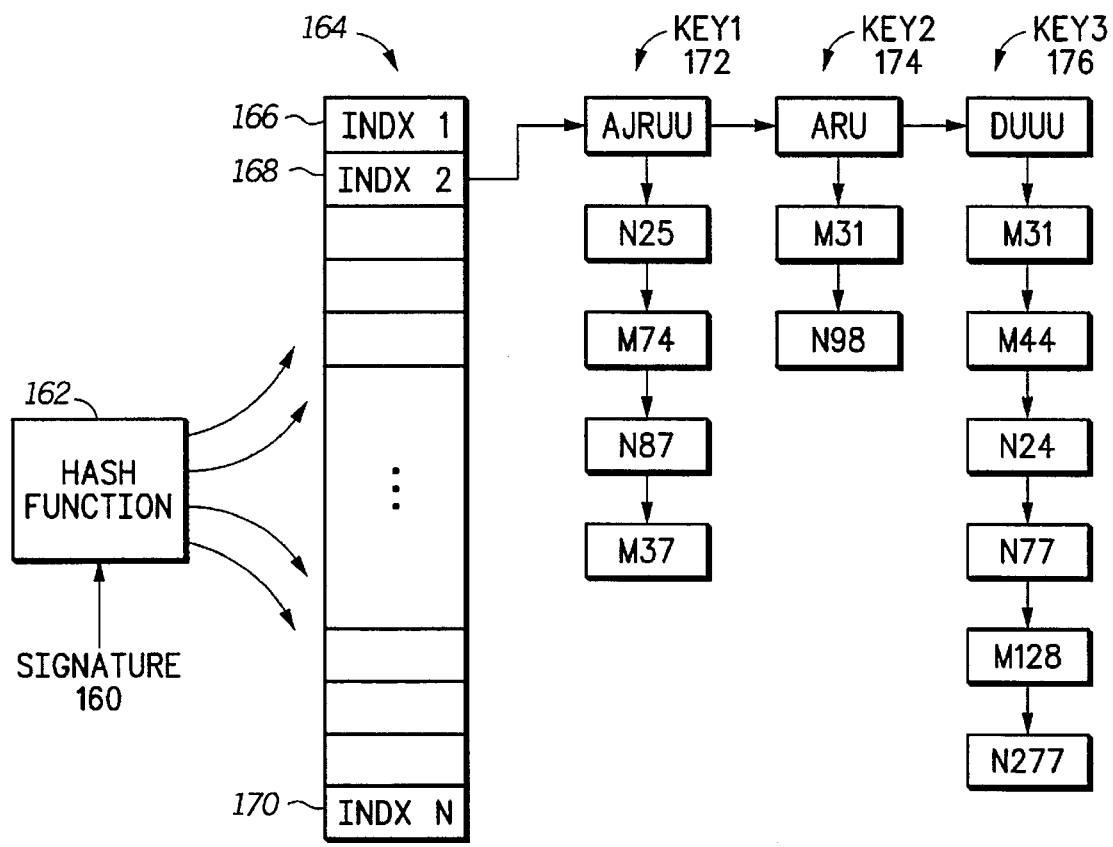
FIG. 6 illustrates a block diagram of the methodology for determining correspondences using a hashing function.

FIG. 6 illustrates a block diagram of the particular structure implemented in the present invention for establishing correspondences between storage elements. Preferably, the method of the present invention includes establishing a hash table wherein the signatures of the plurality of storage elements of the first circuit model and the signatures of the plurality of the storage elements of the second circuit model serve as hash table keys. Signature 160 is provided through a hashing function 162 to produce a hash index that points to a particular location within an array 164.

The hashing function 162 provides indexes based upon the signature 160 provided to the hashing function 162. The particular hashing function 162 illustrated produces index 1 166, index 2 168 through index N 170. Each of the indexes in the array points to a particular collision chain. For example, index 2 168 points to the collision chain including key 1 172, key 2 174, and key 3 176. Each of the keys is a signature that has produced index 2 when provided to the hashing function 162. Key 1 172 corresponds to a particular signature, key 2 174 corresponds to another signature, and key 3 176 corresponds to still another signature, each of the signatures producing the same index when input to the hashing function 162.

Stored under each key is the identity of each storage element having the particular signature of the key. In FIG. 5 key 1 is equal to the string (A,J,R,U,U), key 2 174 is equal to the string (A,R,U), and key 3 176 is equal to the string (D,U,U,U). Under key 1 172 are stored the identity of each storage element having the signature (A,J,R,U,U). Under key 1 172 are stored the identities of storage element N25 128, storage element M74, storage element N87, and storage element M37.

As was previously discussed with reference to FIG. 4 and FIG. 5, storage elements having the prefix "N" correspond to the first circuit model while the storage elements having the prefix "M" correspond to the second circuit model. Thus, under key 1 172 two storage elements from the first circuit model and two storage elements from the second circuit model have been identified to have the identical signature (A,J,R,U,U). This signature could be a support signature, an inverse support signature, or a simulation signature. In accordance with a preferred implementation of the present invention, no limitation is made with respect to the type of signature 160 provided to the hashing function. In a preferred form of the present invention a separate hash table is kept for each type of signature. However, the procedure used to create the hash table is identical for each hash table.

Under key 2 174, the identities of storage elements M31 and N98 are stored. As was discussed with reference to FIG. 5, storage element M31 had the support signature of (A,R, U). Storage element N98 from the second circuit model has the identical support signature (A,R,U) and is also identified under key 2 174. Storage elements having the signature (D,U,U,U) are identified under key 3 176 and include storage elements M31, M44, N24, N77, M128 and N277. Thus, three storage elements from the first circuit model and three storage elements from the second circuit model have the identical signature (D,U,U,U).

In accordance with the present invention, when exactly two hash table entries reside under a hash table key and one of the hash table entries corresponds to the first circuit model and the other hash table entry corresponds to the second circuit model, the method determines that the storage element of the first model corresponding to the hash table key corresponds to the storage element of the second model corresponding to the hash table key. Therefore, under key 174 of FIG. 6, storage element M31 from the first circuit model corresponds to storage element N98 of the second circuit model. A correspondence has been determined and storage element M31 and storage N98 are assigned a correspondence condition or match condition. In the next iteration of the method of the present invention, storage elements M31 and N98 will not have the unknown designation (U) but will be assigned a known designation for the determination of other support and inverse support signatures. After each iteration when a correspondence between storage elements has been determined, additional information is available to determine further correspondences. The iterative nature of the present invention therefore allows for further refinement at each iteration step.

Figure 7:
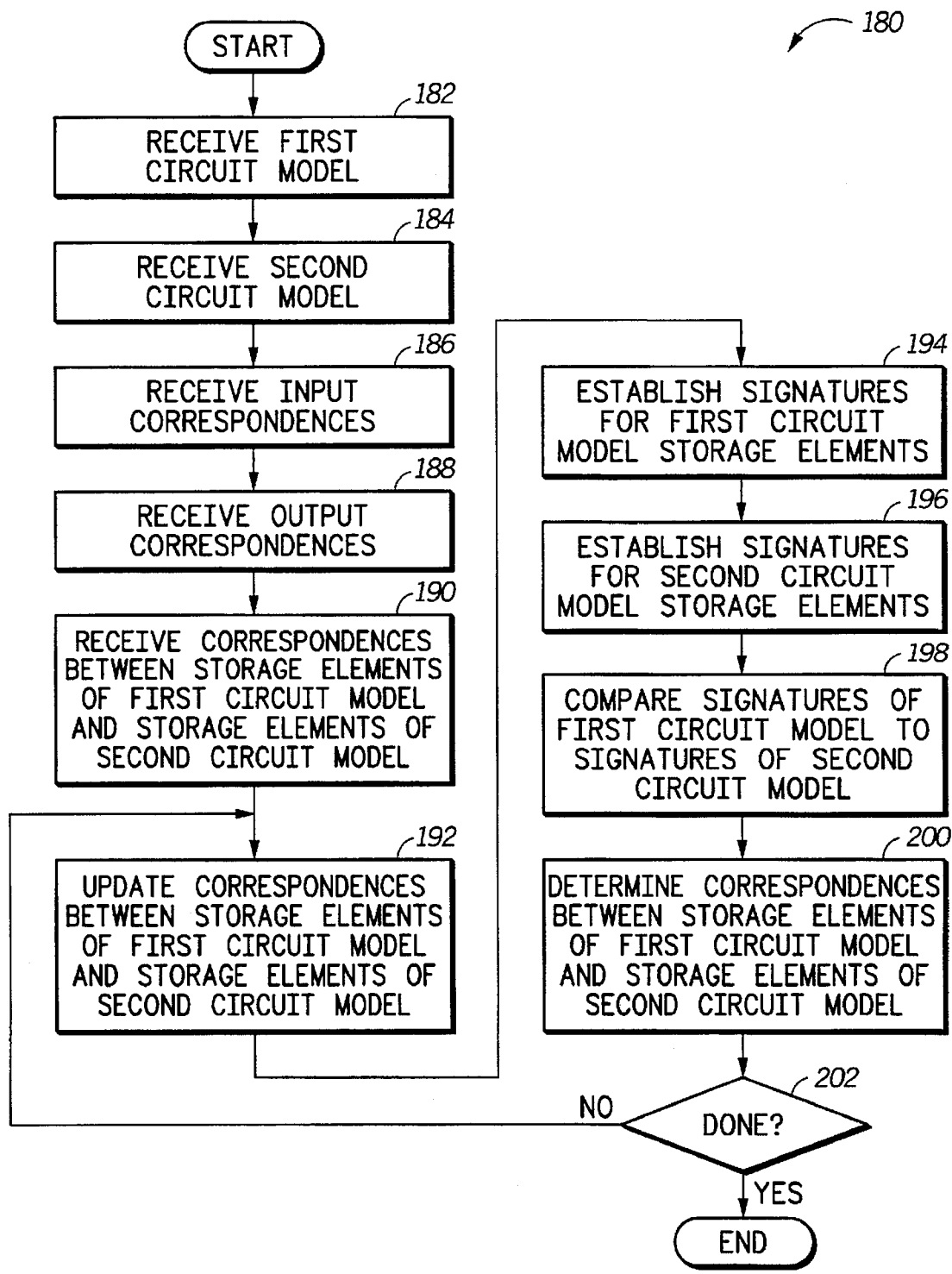
FIG. 7 illustrates a flow diagram of a method for deriving correspondences between storage elements of a first circuit model and storage elements of a second circuit model in accordance with the present invention.

FIG. 7 illustrates a method for deriving correspondence between storage elements of a first circuit model and storage elements of a second circuit model 180. The method includes as a first step receiving a first circuit model 182. The first circuit model including a plurality of inputs, a plurality of outputs, a plurality of storage elements and a plurality of logic functions. Next, step 184 includes receiving a second circuit model wherein the second circuit model includes a plurality of inputs, a plurality of outputs, a plurality of storage elements and a plurality of logic functions. Input correspondences are next received at step 186, wherein the input correspondences relate the plurality of inputs of the first circuit model to the plurality of inputs of the second circuit model.

The method proceeds to step 188 wherein the method includes receiving output correspondences between the plurality of outputs of the first circuit model and the plurality of outputs of the second model. The method includes step 190 of receiving correspondences between storage elements of the first circuit model and storage elements of the second circuit model. In this fashion, the user may give the method an advance starting point by relating the correspondence of particular storage elements of the first circuit model to particular storage elements of the second circuit model. The method therefore may more quickly determine the correspondences of the other storage elements of the first circuit model with the other storage elements of the second circuit model based upon the user provided information.

In step 192 the method includes updating the correspondences between the storage elements of the first circuit model and the storage elements of the second circuit model. Typically, step 192 will only be executed after an iteration of the method of the present invention. Upon a first pass, the updated correspondences will relate merely to the receipt of the initial correspondences from the user. Next, at step 194 the method includes establishing signatures for storage elements of the first circuit model. Step 194 may include establishing support signatures, inverse support signatures, and simulation signatures. Next, at step 196 the method includes establishing signatures for storage elements of the second circuit model. Step 196 as well may include the steps of establishing support signatures, inverse support signatures, and simulation signatures.

At step 198, the method includes comparing signatures of the first circuit model to the signatures of the second circuit model. At step 200, the method includes determining correspondences between the storage elements of the first circuit model and the storage elements of the second circuit model. Preferably, a correspondence is determined when a signature of one of the plurality of storage elements of the first circuit model compares favorably to a signature of one of the plurality of the storage elements of the second circuit model. In a preferred method of the comparison of step 200, as was described with reference to FIG. 6, a correspondence is determined when only one of the storage elements of the first circuit model has a signature which matches a signature of only one of the storage elements of the second circuit model. In this fashion, it can be guaranteed that no inadvertent correspondences are determined.

Next, in step 202, the method queries whether the steps of the method are complete. If the method is done, and each of the storage elements of the first circuit model has been corresponded with a storage element of a second circuit model, the method ends. Otherwise, the method proceeds to step 192 wherein the correspondences are updated and the steps of the method are repeated until the method is complete.

The method preferably includes establishing a simulation signature for at least some of the plurality of storage elements of the first circuit model and for at least some of the plurality of storage elements of the second circuit model. In establishing a simulation signature, the method includes setting at least some of the storage elements of the plurality of storage elements of the first circuit model's predetermined storage element values, setting the plurality of inputs of the first circuit model's predetermined input values, and operating the circuit model to generate a simulation signature.

Figure 8:
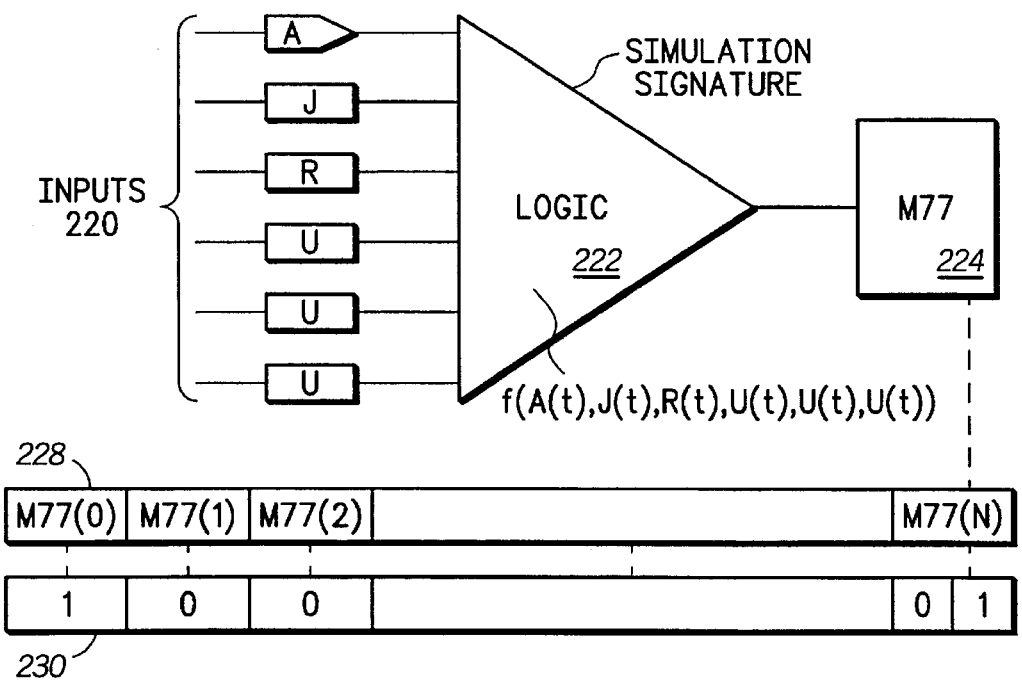
FIG. 8 illustrates a block diagram of the relationship between inputs and the logic functions required to generate a simulation signature for a particular storage element in accordance with the present invention.

FIG. 8 illustrates a representation of how a simulation signature is determined for a particular storage element. In general, a simulation signature is simply the value of a particular storage element during sequential operations or clock cycles of the circuit model. With reference to FIG. 8, a simulation signature for storage element M77 224 is determined based upon the inputs 220 to the storage element and the logic functions 222 input to storage element M77 224. Inputs 220 to logic function 222 include primary input A, corresponded storage element J, corresponded storage element R and three uncorresponded storage elements. Preferably, primary inputs are set to a desired value, for example logic zero for storage element A. Corresponded storage elements are also set to known values. For example, corresponded storage element J is set to logic 1 at time step 0 while corresponded storage element R is set to logic 0 at time step 0.

As one skilled in the art will readily appreciate, in order to produce identical simulation results between the first circuit model and the second circuit model, certain parameters must be set. First, the inputs provided to the first circuit model must be identical to the inputs provided to the second circuit model for each time step. Because the inputs of the first circuit model have previously been corresponded to the inputs of the second circuit model, providing identical inputs is easily accomplished. Second, the state of the corresponded storage elements must be set at time step 0 to the same value. Since the identities of the corresponded storage elements are known, the corresponded storage elements may be set to equal values individually or as a whole. Third, all uncorresponded storage elements must be set to equal values. Since the correspondences of the uncorresponded elements are unknown, all uncorresponded elements must be set to logic 1 or all uncorresponded elements must be set to logic 0. By setting the values of all inputs and storage element states at time step 0, it will be guaranteed, then, that the starting points for the simulation will be consistent between the first circuit model and the second circuit model.

Because storage element M77 224 is not corresponded to a storage element in the second circuit model and retains the U designation, at time step 0 the storage element M77 224 is set at a logical 1 value just as all other uncorresponded storage elements are set. Thus, the first entry in the simulation signature for storage element M77 224 is logic 1, the value of the storage element at time step 0.

The value of storage element M77 224 is determined by the logic function 222. The funtion implemented by this function is f(A, J, R, U, U, U). The simulation signature 228 of storage element M77 224 may be logically described as the value of the storage element M77 224 at successive time intervals. Simulation signature 228, therefore, has a first entry equal to the value of the storage element at time step 0, at time step 1, and so forth until the last time step of the simulation. Thus, as a numerical representation, the simulation signature 230 of storage element M77 224 is the string (1,0,0, . . . ,0,1). However, a longer simulation signature could be generated by concatenating sequences of shorter simulation signatures. In this fashion, because the likelihood of generating unique simulation signatures increases, more storage elements will be corresponded at each iteration of the method of the present invention.

The simulation signature is preferably used as a hash table key just as the support signatures and inverse support signatures were used. In this fashion, the simulation signatures may be used to determine correspondences between the storage elements of the first circuit model and the storage elements of the second circuit model as well.

Figure 9:
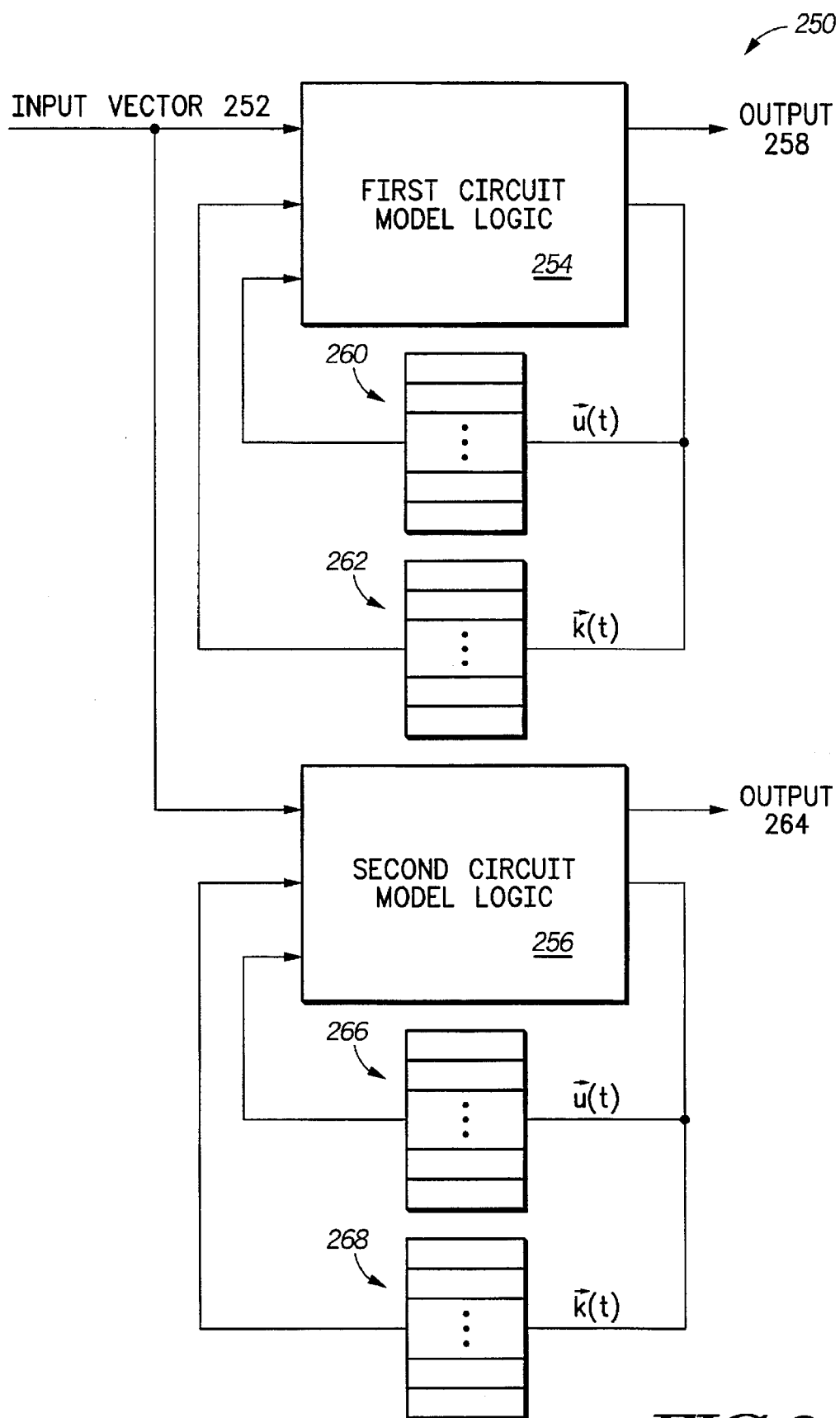
FIG. 9 illustrates a block diagram of functions used for generating simulation signatures of storage elements in accordance with the present invention.

FIG. 9 illustrates a block diagram of the logical flow of information required to create the simulation signature for the first circuit models and the second circuit models. The methodology 250 includes providing input vector 252 to the first circuit model logic 254 and the second circuit model logic 256. The first circuit model 254 provides an output 258 which may be verified to some known output that should be generated by the first circuit model logic. At each time step, a vector 260 will be produced based upon the uncorresponded storage elements—values. The vector 260 will include as a time 0 entry the assigned logical values of the uncorresponded storage elements. Vector 262 contains the values of the corresponded storage elements for particular time steps. Because the corresponded storage elements have been corresponded between the first circuit model and the second circuit model, the starting point or time step 0 of the vector 262 is preferably set to a desired value. However, vector 260 of the uncorresponded storage element at time 0 must be set to either all 1's or all 0's for both the first circuit model and the second circuit model at time step 0 to guarantee a uniform starting point between the models.

The second circuit model logic 256 also produces an output 264. The output 264 is compared to the output 258 of the first circuit model logic 254 or to a known output that should be produced by the logic. The comparison serves as a check to the operation of the circuit models. The second circuit model logic 256 also produces the uncorresponded storage element values in a vector form 266. As with the first circuit model logic 254, the uncorresponded storage element vector 266 is set to either logic 1's or logic 0's at time step 0. However, the value to which the vector 266 is set must be the same as that of the vector 260 of the first circuit model logic 254. The corresponded storage element vector 268 must be set to a same value at time step 0 as the corresponded storage element vector 262 associated with the first circuit model logic 254. Such is required to guarantee a starting value correspondence between the first circuit model logic 254 and the second circuit model logic 256. At each time step interval of the first circuit model logic 254 and the second circuit model logic 256 the input vector 252 will be provided to both of the circuit models.

During the simulation, the first circuit model logic 254 will produce the uncorresponded storage element vector 260 as well as the corresponded storage element vector 262 to generate simulation signatures for each of the uncorresponded storage elements of the first circuit model logic 254. In the same fashion, the second circuit model logic 256 will produce the uncorresponded storage element vector 266 and the corresponded storage element vector 268 to produce the simulation signatures of the uncorresponded storage element vectors of the second circuit model. In this fashion, the logical circuitry illustrated in FIG. 8 produces the simulation signatures for both the first circuit model and the second circuit model.

Figure 10:
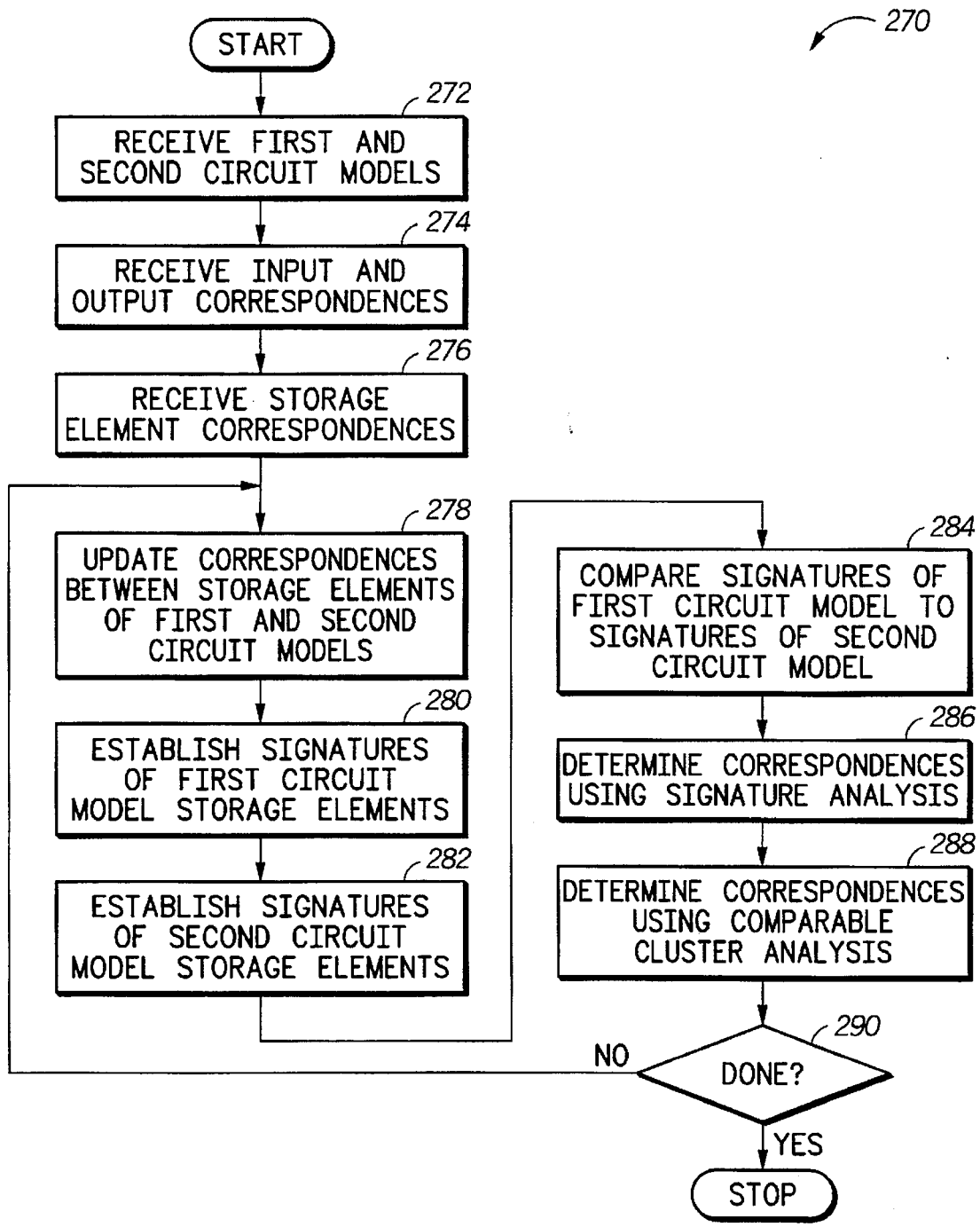
FIG. 10 illustrates a flow diagram of a method for deriving correspondences between storage elements of a first circuit model and storage elements of a second circuit model including compatible cluster analysis in accordance with the present invention.

FIG. 10 illustrates a method 270 for deriving the correspondences between storage elements of the first circuit model and the storage elements of the second circuit model incorporating compatible cluster analysis. The method includes a first step 272 of receiving a first circuit model and a second circuit model. The first circuit model includes a plurality of inputs, a plurality of outputs, a plurality of storage elements and a plurality of logic functions. The second circuit model includes a plurality of inputs, a plurality of outputs, a plurality of storage elements and a plurality of logic functions.

Next, at step 274, the method includes receiving input and output correspondences between the inputs of the first circuit model and the inputs of the second circuit model and the outputs of the first circuit model and the outputs of the second circuit model. Next, step 276, the method includes receiving storage element correspondences between storage elements of the first circuit model and storage elements of the second circuit model. Next, at step 278, the method includes updating the correspondences between the storage elements of the first circuit model and the storage elements of the second circuit model. In a first iteration of the method 270, the updating would include simply receiving the storage element correspondences in 276 and updating the necessary storage wherein the correspondences are contained.

At step 280, the method includes establishing signatures for the first circuit model storage elements. At step 282, the method includes establishing signatures for the second circuit model storage elements. The signatures preferably include support signatures, inverse support signatures, and simulation signatures although any of the signatures could be employed. Next, at step 284, the method includes comparing the signatures of the storage elements of the first circuit model to the signatures of the storage elements of the second circuit model. At step 286, the method includes determining correspondences of the storage elements of the first circuit model and the storage elements of the second circuit model using signature analysis. Signature analysis being described previously.

Next, at step 288, the method includes determining the correspondences between storage elements of the first circuit model and storage elements of the second circuit model using compatible cluster analysis. Compatible cluster analysis will be described further herein in association with the subsequent figures. Next, at step 290, it is determined whether the method is done. If the method is done the method ceases. However, if the method is not done, wherein all the correspondences have not been determined, the method proceeds again to step 278 wherein further correspondences are determined. Thus, step 270 of the method of FIG. 10 includes the further step of compatible cluster analysis which will be further described.

Figure 11:
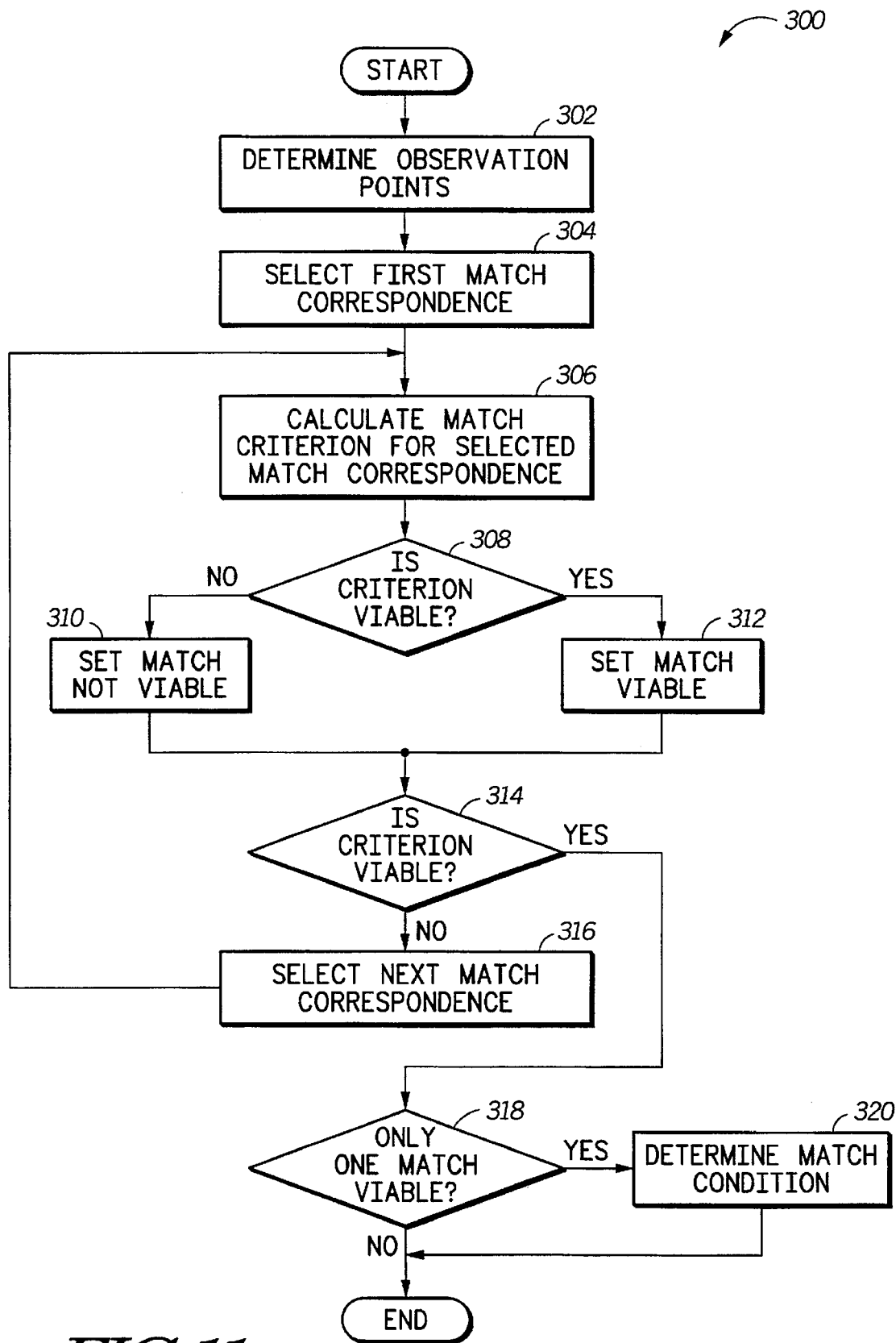
FIG. 11 illustrates a flow diagram detailing steps employed in a compatible cluster analysis in accordance with the present invention.

FIG. 11 illustrates a method of performing compatible cluster analysis in accordance with the present invention as illustrated in step 288 of FIG. 10. The method includes as a first step 302 determining observation points. Determining an observation point includes two steps. The first step relates to identifying uncorresponded storage elements of the first circuit model and uncorresponded storage elements of the second circuit model each having matching signatures. Compatible cluster analysis is performed on only those storage elements having matching signatures. As one skilled in the art will readily appreciate, compatible cluster analysis will be performed when at least four storage elements have identical signatures. Assuming four storage elements, the four uncorresponded storage elements will include two uncorresponded storage elements from the first circuit model and two uncorresponded storage elements from the second circuit model. In any event, the same number of uncorresponded storage elements will come from the first circuit model as from the second circuit model. As a practical matter, however, due to the complexity of compatible cluster analysis, a maximum number of storage elements may be considered. In this fashion, the compatible cluster analysis seeks to determine a correspondence between each of the storage elements selected from the first circuit model and each of the storage elements selected from the second circuit model that have matching signatures.

As a second step, determining an observation point of step 302 further includes looking at the inverse support signature of a particular storage element selected. For example, with reference to FIG. 4, storage elements N25 includes an inverse support signature of (C,D,U,U). From this inverse support signature 140, the observation point will include those storage elements and primary outputs that have been identified or corresponded. In the case of storage element N25 of FIG. 4 the observation point will include primary output C and storage element D. The same methodology will be used to determine the observation point for each of the other uncorresponded storage elements having the identical signature.

The method 300 next includes at step 304, selecting a first match correspondence. The match correspondence relates a possible match correspondence between the storage elements of the compatible cluster. For example, if the compatible cluster included storage elements N25, M74, N87 and M37 a first possible match correspondence would be storage element N25 with storage element M74 and storage N87 with storage element N37. The first match correspondence is selected at random from the possible match correspondences.

The method next proceeds to step 306 wherein a match criteria is selected for the particular match correspondence. Preferably, step 306 includes calculating a binary decision diagram as the match correspondence. As one skilled in the art will readily appreciate, determining a match criteria based upon building a binary decision diagram for a particular match correspondence will enable a determination of whether the criteria is viable. Constructing a binary decision diagram for a particular logic function is well known in the art and the details of such will not be further described herein. In the construction of a binary decision diagram, the inputs to the observation point may include storage elements that have not been corresponded yet. Thus, consistent with the methodology previously described, the values of the uncorresponded storage elements are set to the same constant logic value. In some situations, as one skilled in the art will readily appreciate, a binary decision diagram cannot be created for a particular match correspondence due to the complexity of the logic. Thus, in this situation, it is determined that the particular match correspondence is viable for the compatible cluster analysis.

The method next proceeds to step 308 where it is determined whether or not the match criteria is viable for the particular match correspondence. If the particular match criteria is not viable, the method proceeds to step 310 where it is determined that the assumed match correspondence is incorrect and otherwise not viable. However, at step 308, if it is determined that the criteria is viable, the method proceeds to step 312 where it is determined that the assumed match correspondence is viable.

From step 310 to step 312 the method proceeds to step 314 where it is determined whether all correspondences of the compatible cluster analysis have been tried. If the answer is NO, the method proceeds to step 316 wherein the next match correspondence is selected. From step 316 the method proceeds again to step 306 wherein a match criteria is determined for the selected match correspondence. The loop included via step 316 is repeated until each possible match correspondence has been analyzed to determine whether or not it is viable.

Once all possible match correspondences have been tried, the method proceeds to step 318 where it is determined whether only one match of the possible match correspondences is viable. If at step 318 it is determined that there is only one viable match, the method proceeds to step 320 where it is determined that the particular match correspondence is valid and a match condition is determined. Because at least four storage elements have been consumed within the compatible cluster analysis, step 320, therefore, determines at least two correspondences between pairs of storage elements. From step 320, the compatible cluster analysis ends.

If at step 318 it is determined that more than one match correspondence of the possible match correspondences is viable, then no matches are determined and the compatible cluster analysis has not further corresponded storage elements from the first circuit model and the second circuit model. From step 318 without only one viable match, the method ends.

Thus, the method 300 of using compatible cluster analysis provides further refinements of the method of the present invention. When the signature analysis of the present invention fails to determine correspondences, compatible cluster analysis may be used to determine further correspondences that could not be determined by the signature analysis alone. Thus, the compatible cluster analysis of the present invention provides benefits unachievable simply through the signature analysis previously described. However, both the signature analysis and compatible cluster analysis provide benefits previously unobtained through prior art methodologies.

Figure 12:
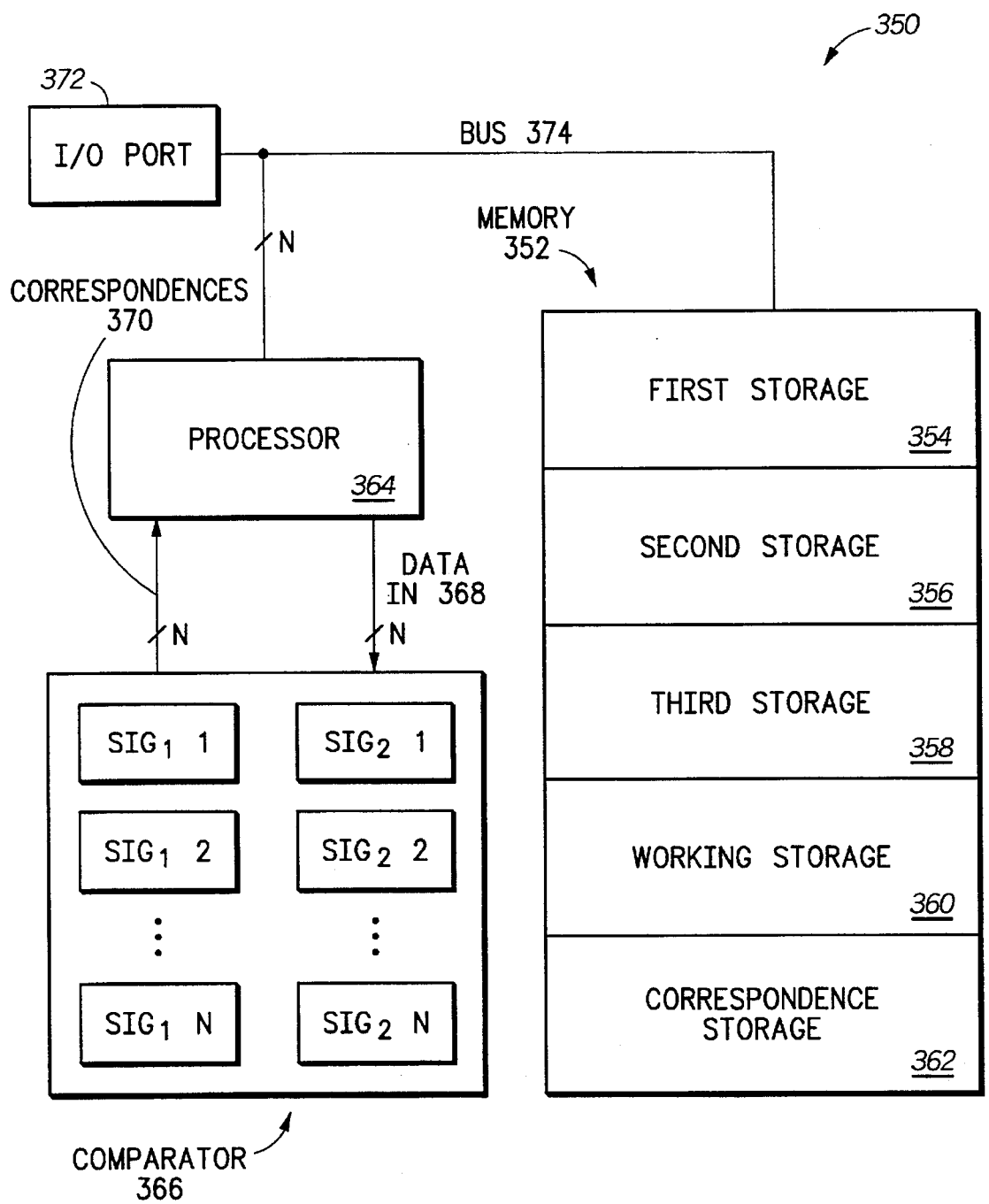
FIG. 12 illustrates a block diagram illustrating an apparatus for deriving correspondences between storage elements of a first circuit model and storage elements of a second circuit model.

FIG. 12 illustrates an apparatus 350 for deriving the correspondence between storage elements of the first circuit model and storage elements of the second circuit model. The apparatus 350 preferably comprises first storage 354, second storage 356, third storage 358, processor 364 and comparator 366. The first storage 354 preferably stores the first circuit model wherein the first circuit model includes a plurality of inputs, a plurality of outputs, a plurality of storage elements and a plurality of logic functions. Preferably the first storage 354, second storage 356 and third storage 358 are included within a memory 352 that is known in the art. Second storage 356 preferably stores a second circuit model comprising a plurality of inputs, a plurality of outputs, a plurality of storage elements and a plurality of logic functions. The storage 358 stores data matching the inputs of the first circuit model with the inputs of the second circuit model and data matching the outputs of the first circuit model with the outputs of the second circuit model.

Preferably, memory 352 further includes working storage 360 and correspondence storage 362. The working storage 360 is used as a work path by the processor 364. The correspondence storage 362 preferably includes correspondences between storage elements of the first circuit model and storage elements of the second circuit model.

The processor 364 communicates with memory 352 via a bus 374 having a width N. Both the processor 364 and the memory 352 may receive data over the bus 374 from an input/output port 372. The processor establishes a signature for at least some of the plurality of storage elements of the first circuit model and a signatures for at least some of the plurality of storage elements of the second circuit model. The processor communicates with the comparator 366 via data in bus 368 and correspondence bus 370. While the data in bus 368 and the correspondence bus 370 could comprise a single bus having duplex data transfer, and could also incorporate two separate buses as depicted in FIG. 12.

Comparator 366 determines a correspondence between a storage element of the first circuit model and a respective storage element of a second circuit model when a comparison between the respective storage elements is favorable. As is depicted, a comparison may be performed by inputting a plurality of signatures from the first circuit model and a plurality of signatures from the second circuit model and simply comparing the signatures to determine a correspondence. Preferably, a comparison is favorable when only one signature from the first circuit model equals only one signature from the second circuit model. However, as has been previously described with reference to the method of the present invention, the apparatus of the present invention may perform comparisons in other fashions as well. Thus, the apparatus and method of the present invention provide many important benefits not provided by the prior devices. Utilizing the apparatus and method of the present invention, correspondences may be determined between storage elements of the respective first and second circuit models. The correspondences may be used to further verify the design of circuit models to increase efficiency in the design of integrated circuitry and their subsequent manufacture.

The above described preferred embodiments are intended to illustrate the principles of the invention, but not to limit the scope of the invention. Various other embodiments and modifications to these preferred embodiments may be made by those skilled in the art without departing from the scope of the following claims.

We claim:

1. A method for deriving a correspondence between storage elements of a first circuit model and storage elements of a second circuit model, the method used in circuit verification and modeling and comprising the steps of:
   (a) receiving a first circuit model, wherein the first circuit model includes a plurality of inputs, a plurality of outputs, a plurality of storage elements, and a plurality of logic functions;
   (b) receiving a second circuit model, wherein the second circuit model includes a plurality of inputs, a plurality of outputs, a plurality of storage elements, and a plurality of logic functions;
   (c) receiving an input correspondence between the plurality of inputs of the first circuit model and the plurality of inputs of the second circuit model;
   (d) receiving an output correspondence between the plurality of outputs of the first circuit model and the plurality of outputs of the second circuit model;
   (e) establishing a signature for at least some of the plurality of storage elements of the first circuit model;
   (f) establishing a signature for at least some of the plurality of storage elements of the second circuit model; and
   (g) when a signature of one of the plurality of storage elements of the first circuit model compares favorably to a signature of one of the plurality of storage elements of the second circuit model, determining a correspondence between the storage element of the first circuit model with the respective storage element of the second circuit model.

2. The method of claim 1 wherein, in step (g), the signature of one of the plurality of storage elements of the first circuit model compares favorably to the signature of one of the plurality of storage elements of the second circuit model when only one of the signatures of the plurality of storage elements of the first circuit model equals only one of the signatures of the storage elements of the second circuit model.

3. The method of claim 1 wherein step (g) includes the steps of:
   establishing a hash table, wherein the signatures of the plurality of storage elements of the first circuit model and the signatures of the plurality of storage elements of the second circuit model serve as hash table keys, wherein the hash table has an entry for each of the signatures of the first circuit model and for each of the signatures of the second circuit model; and
   when exactly two hash table entries reside under a hash table key and one of the exactly two hash table entries corresponds to the first circuit model and the other of the exactly one hash table entry corresponds to the second circuit model, determining that the storage element of the first model corresponding to the hash table key corresponds to the storage element of the second model corresponding to the hash table key.

4. The method of claim 1 further comprising the step of:
   (h) receiving at least one correspondence between a storage element of the first circuit model and a storage element of the second circuit model.

5. The method of claim 1 wherein:
   in step (e), establishing a signature for the at least some of the storage elements of the first circuit model includes, for a storage element of the first circuit model, a step of establishing a support signature based on a plurality of storage elements and a plurality of inputs providing input to a logic function driving the storage element of the first circuit model; and
   in step (f), establishing a signature for the at least some of the storage elements of the second circuit model includes, for a storage element of the second circuit model, a step of establishing a support signature based on a plurality of storage elements and a plurality of inputs providing input to a logic function driving the storage element of the second circuit model.

6. The method of claim 1 wherein:
   in step (e), establishing a signature for the at least some of the storage elements of the first circuit model includes, for a storage element of the first circuit model, a step of establishing an inverse support signature based on a plurality of storage elements and a plurality of outputs receiving input from logic functions driven by the storage element of the first circuit model; and
   in step (f), establishing a signature for the at least some of the storage elements of the second circuit model includes, for a storage element of the second circuit model, a step of establishing an inverse support signature based on a plurality of storage elements and a plurality of outputs receiving input from logic functions driven by the storage element of the second circuit model.

7. The method of claim 1 wherein:
   in step (e), establishing a signature for at least some of the plurality of storage elements of the first circuit model comprises the steps of:
   (i) setting at least some of the storage elements of the plurality of storage elements of the first circuit model to predetermined storage element values;
   (ii) setting the plurality of inputs of the first circuit model to predetermined input values; and
   (iii) operating the first circuit model to generate a simulation signature for the storage elements of the first circuit, wherein each entry of a simulation signature of a storage element of the first circuit model is based on a respective value stored in a respective storage element at a respective point in the operation of the first circuit model; and
   in step (f), establishing a signature for at least some of the plurality of storage elements of the second circuit model comprises the steps of:
   (i) setting at least some of the storage elements of the plurality of storage elements of the second circuit model to the predetermined storage element values;
   (ii) setting the plurality of inputs of the second circuit model to the predetermined input values;
   (iii) operating the second circuit model to generate a simulation signature for the storage elements of the second circuit, wherein each entry of a simulation signature of a storage element of the second circuit model is based on a respective value stored in the respective storage element at a respective point in the operation of the second circuit model.

8. The method of claim 7 wherein, for each storage element without a corresponding storage element, setting a value of the storage element to logic one.

9. The method of claim 7 wherein, for each storage element without a corresponding storage element, setting a value of the storage element to logic zero.

10. The method of claim 7 wherein, each of a corresponding pair of storage elements is set to an identical logical value.

11. A method for deriving the correspondence between storage elements of a first circuit model and storage elements of a second circuit model, the method used in circuit verification and modeling and comprising the steps:

(a) receiving a first circuit model and a second circuit model, wherein the first circuit model includes a plurality of inputs, a plurality of outputs, a plurality of storage elements, and a plurality of logic functions, and wherein the second circuit model includes a plurality of inputs, a plurality of outputs, a plurality of storage elements, and a plurality of logic functions;

(b) receiving an input correspondence between the plurality of inputs of the first circuit model and the plurality of inputs of the second circuit model;

(c) receiving an output correspondence between the plurality of outputs of the first circuit model and the plurality of outputs of the second circuit model;

(d) establishing a first support signature for at least some of the plurality of storage elements of the first circuit model and establishing a second support signature for at least some of the plurality of storage elements of the second circuit model;

(e) when the first support signature of one of the plurality of storage elements of the first circuit model compares favorably to the second support signature of one of the plurality of storage elements of the second circuit model, determining a correspondence between the storage element of the first circuit model with a respective storage element of the second circuit model;

(f) establishing a first inverse support signature for at least some of the plurality of storage elements of the first circuit model and establishing a second inverse support signature for at least some of the plurality of storage elements of the second circuit model; and (g) when the inverse support signature of one of the plurality of storage elements of the first circuit model compares favorably to the inverse support signature of one of the plurality of storage elements of the second circuit model, determining a correspondence between the storage element of the first circuit model with the respective storage element of the second circuit model.

12. The method of claim 11 further comprising the steps of:

(h) establishing a simulation signature for at least some of the plurality of storage elements of the first circuit, wherein establishing a simulation signature comprises the steps of:

(i) setting at least some of the storage elements of the plurality of storage elements of the first circuit model to predetermined storage element values;

(ii) setting the plurality of inputs of the first circuit model to predetermined input values; and (iii) operating the first circuit model to generate a simulation signature for the storage elements of the first circuit, wherein each entry of a simulation signature of a storage element of the first circuit model is based on a respective value stored in a respective storage element at a respective point in the operation of the first circuit model; and (i) establishing a simulation signature for at least some of the plurality of storage elements of the second circuit, wherein establishing a simulation signature comprises the steps of:

(i) setting at least some of the storage elements of the plurality of storage elements of the second circuit model to the predetermined storage element values;

(ii) setting the plurality of inputs of the second circuit model to the predetermined input values;

(iii) operating the second circuit model to generate a simulation signature for the storage elements of the second circuit, wherein each entry of a simulation signature of a storage element of the second circuit model is based on a respective value stored a the respective storage element at a respective point in the operation of the second circuit model; and (j) when the simulation signature of one of the plurality of storage elements of the first circuit model compares favorably to the simulation signature of one of the plurality of storage elements of the second circuit model, determining a correspondence between the storage element of the first circuit model with the respective storage element of the second circuit model.

13. A method for deriving the correspondence between storage elements of a first circuit model and storage elements of a second circuit model, the method used in circuit verification and modeling and comprising the steps of:

(a) receiving a first circuit model, wherein the first circuit model includes a plurality of inputs, a plurality of outputs, a plurality of storage elements, and a plurality of logic functions;

(b) receiving a second circuit model, wherein the second circuit model includes a plurality of inputs, a plurality of outputs, a plurality of storage elements, and a plurality of logic functions;

(c) receiving an input correspondence between the plurality of inputs of the first circuit model and the plurality of inputs of the second circuit model;

(d) receiving an output correspondence between the plurality of outputs of the first circuit model and the plurality of outputs of the second circuit model;

(e) operating the first circuit model to generate a simulation signature for at least some of the storage elements of the first circuit model, wherein each entry of a simulation signature of a storage element of the first circuit model is based on a value stored in the storage element at a respective point in the operation of the first circuit model;

(f) operating the second circuit model to generate a simulation signature for at least some of the storage elements of the second circuit, wherein each entry of a simulation signature of a storage element of the second circuit model is based on a value stored in the storage element at a respective point in the operation of the second circuit model; and (g) when the simulation signature of one of the plurality of storage elements of the first circuit model compares favorably to the simulation signature of one of the plurality of storage elements of the second circuit model, determining a correspondence between the storage element of the first circuit model with a respective storage element of the second circuit model.

14. The method of claim 13 wherein:
step (e) further comprises the steps of:
(i) setting at least some of the storage elements of the plurality of storage elements of the first circuit model to predetermined storage element values;
(ii) setting the plurality of inputs of the first circuit model to predetermined input values; and step (f) further comprises the steps of:
(i) setting at least some of the storage elements of the plurality of storage elements of the second circuit model to the predetermined storage element values; and
(ii) setting the plurality of inputs of the first circuit model to the predetermined input values.

15. The method of claim 13 wherein step (g) includes the steps of:
establishing a hash table, wherein the simulation signatures of the plurality of storage elements of the first circuit model and the signatures of the plurality of storage elements of the second circuit model serve as hash table keys, wherein the hash table has an entry for each of the simulation signatures of the first circuit model and for each of the simulation signatures of the second circuit model; and
when exactly two hash table entries reside under a hash table key and one of the hash table entries corresponds to the first circuit model and the other hash table entry corresponds to the second circuit model, determining that the storage element of the first model corresponding to the hash table key corresponds to the storage element of the second model corresponding to the hash table key.

16. A method for deriving a correspondence between storage elements of a first circuit model and storage elements of a second circuit model, the method used in circuit verification and modeling and comprising the steps of:
(a) receiving a first circuit model, wherein the first circuit model includes a plurality of inputs, a plurality of outputs, a plurality of storage elements, and a plurality of logic functions;
(b) receiving a second circuit model, wherein the second circuit model includes a plurality of inputs, a plurality of outputs, a plurality of storage elements, and a plurality of logic functions;
(c) receiving an input correspondence between the plurality of inputs of the first circuit model and the plurality of inputs of the second circuit model;
(d) receiving an output correspondence between the plurality of outputs of the first circuit model and the plurality of outputs of the second circuit model;
(e) establishing a signature for at least some of the plurality of storage elements of the first circuit model;
(f) establishing a signature for at least some of the plurality of storage elements of the second circuit model; and
(g) when the signature of one of the plurality of storage elements of the first circuit model compares favorably to the signature of one of the plurality of storage elements of the second circuit model, determining a correspondence between the storage element of the first circuit model with the respective storage element of the second circuit model;
(h) when at least two of the storage elements of the first circuit model and at least two of the storage elements of the second circuit model have identical signatures, determining each possible match correspondence for the storage elements having the identical signatures;
(i) for each possible match correspondence, calculating a match criteria based on the plurality of logic functions of the first circuit model and the plurality of logic functions of the second circuit model; and
(j) when only one of the match criterion is valid, matching the storage element of the first circuit model with the respective storage element of the second circuit model.

17. The method of claim 16 wherein, in step (i), calculating a match criteria includes building a binary decision diagram for each possible match correspondence.

18. A computer readable medium, wherein the computer readable medium comprising:
(a) a first set of instructions for receiving a first circuit model, wherein the first circuit model includes a plurality of inputs, a plurality of outputs, a plurality of storage elements, and a plurality of logic functions;
(b) a second set of instructions for receiving a second circuit model, wherein the second circuit model includes a plurality of inputs, a plurality of outputs, a plurality of storage elements, and a plurality of logic functions;
(c) a third set of instructions for receiving an input correspondence between the plurality of inputs of the first circuit model and the plurality of inputs of the second circuit model;
(d) a fourth set of instructions for receiving an output correspondence between the plurality of outputs of the first circuit model and the plurality of outputs of the second circuit model;
(e) a fifth set of instructions for establishing a signature for at least some of the plurality of storage elements of the first circuit model;
(f) a sixth set of instructions for establishing a signature for at least some of the plurality of storage elements of the second circuit model; and
(g) a seventh set of instructions for, when the signature of one of the plurality of storage elements of the first circuit model compares favorably to the signature of one of the plurality of storage elements of the second circuit model, determining a correspondence between the storage element of the first circuit model with the respective storage element of the second circuit model.

19. An apparatus for deriving a correspondence between storage elements of a first circuit model and storage elements of a second circuit model, the apparatus used in circuit verification and modeling, the apparatus comprising:
first storage, wherein the first storage stores a first circuit model, and wherein the first circuit model includes a plurality of inputs, a plurality of outputs, a plurality of storage elements, and a plurality of logic functions;
second storage, wherein the second storage stores a second circuit model, wherein the second circuit model includes a plurality of inputs, a plurality of outputs, a plurality of storage elements, and a plurality of logic functions;
third storage, wherein the third storage stores data equating the plurality of inputs of the first circuit model with the plurality of inputs of the second circuit model and data equating the plurality of outputs of the first circuit model with the plurality of outputs of the second circuit model;

processor, wherein the processor establishes a signature for at least some of the plurality of storage elements of the first circuit model, and wherein the processor establishes a signature for at least some of the plurality of storage elements of the second circuit model; and comparator, wherein when the signature of one of the plurality of storage elements of the first circuit model compares favorably to the signature of one of the plurality of storage elements of the second circuit model, the comparator determines a correspondence between the storage element of the first circuit model and the respective storage element of the second circuit model.

20. The apparatus of claim 19, wherein the comparator further comprises circuitry for determining that the signature of one of the plurality of storage elements of the first circuit compares favorably to the signature of one of the plurality of storage elements of the second circuit model when one of the signatures of the plurality of storage elements of the first circuit model equals one of the signatures of the storage elements of the second circuit model.

21. The apparatus of claim 19 wherein the processor comprises support signature circuitry, wherein the support signature circuitry establishes a support signature at least some of the plurality of storage elements of the first circuit model, and wherein the support signature circuitry establishes a support signature for at least some of a plurality of storage elements of the second circuit model.

22. The apparatus of claim 19 wherein the processor comprises inverse support signature circuitry, wherein the inverse support signature circuitry establishes an inverse support signature for at least some of the plurality of storage elements of the first circuit model, and wherein the inverse support signature circuitry establishes an inverse support signature for at least some of the plurality of storage elements of the second circuit model.

23. The apparatus of claim 19 wherein the processor comprises simulation signature circuitry, wherein the simulation signature circuitry establishes a simulation signature for at least some of a plurality of storage elements of the first circuit model, and wherein the simulation signature circuitry establishes a simulation signature for at least some of the plurality of storage elements of the second circuit model.

24. The apparatus of claim 23, wherein the simulation signature circuitry further comprises element setting circuitry, wherein the element setting circuitry sets at least some of the storage elements of the plurality of storage elements of the first circuit model to a predetermined value, and wherein the element setting circuitry sets at least some of the storage elements of the plurality of storage elements of the second circuit model to the predetermined value.

* * * * *